United States Patent [19]

Wu et al.

[11] Patent Number: 4,968,581
[45] Date of Patent: * Nov. 6, 1990

[54] HIGH RESOLUTION PHOTORESIST OF IMIDE CONTAINING POLYMERS

[75] Inventors: Chengjiu Wu; Anne M. Mooring, both of Morristown; Michael J. McFarland, Middlesex; Christopher E. Osuch, Mine Hill; James T. Yardley, Morristown, all of N.J.

[73] Assignee: Hoechst Celanese Corporation, Somerville, N.J.

[*] Notice: The portion of the term of this patent subsequent to Jun. 6, 2006 has been disclaimed.

[21] Appl. No.: 361,985

[22] Filed: Jun. 6, 1989

Related U.S. Application Data

[62] Division of Ser. No. 832,116, Feb. 24, 1986, Pat. No. 4,837,124.

[51] Int. Cl.$^5$ .................. G03C 1/54; G03C 1/56; G03C 1/73; G03C 5/16
[52] U.S. Cl. .................. 430/192; 430/270; 430/193; 430/326; 430/325; 430/330; 52/31; 52/32; 52/152
[58] Field of Search ............ 430/270, 193, 192, 326, 430/325, 330; 522/31, 32, 152

[56] References Cited

U.S. PATENT DOCUMENTS

| | | | |
|---|---|---|---|
| 3,779,778 | 12/1973 | Smith | 430/270 |
| 3,981,897 | 9/1976 | Crivello | 260/440 |
| 4,101,323 | 7/1978 | Buhr et al. | 430/192 X |
| 4,374,066 | 2/1983 | Crivello | 260/446 |
| 4,450,360 | 5/1984 | Crivello | 430/917 X |
| 4,482,489 | 11/1984 | Pippo | 430/163 X |
| 4,491,628 | 1/1985 | Ito et al. | 430/270 X |
| 4,524,121 | 6/1985 | Gleim et al. | 430/270 X |
| 4,569,897 | 2/1986 | Kalyanaraman | 430/270 X |
| 4,603,101 | 7/1986 | Crivello | 430/270 |

OTHER PUBLICATIONS

W. S. DeForest, *Photoresist: Materials and Processes,* McGraw-Hill Book Company, New York, N.Y., 1975, pp. 93–103, 132–147.

*Primary Examiner*—Cynthia Hamilton
*Attorney, Agent, or Firm*—Richard S. Roberts

[57] ABSTRACT

Photoresist compositions suitable for deep UV and excimer laser lithography are disclosed that are mixtures of a photoacid and a polymer having imide residues to which acid labile groups are attached. These compositions provide high resolution, high contrast and high sensitivity in the deep UV (wavelength of 250–300 nm), mid-UV (wavelength of 300–350 nm) or conventional (wavelength of 350–450 nm) exposure bands. The compositions are also suitable for exposure at wavelengths commonly associated with excimer laser sources (248, 308 nm) or for exposure by X-radiation.

In the compositions disclosed, the imide group

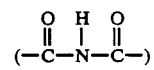

can be blocked with certain groups, X, to form compounds containing the structure

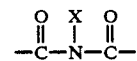

which have solubility properties different from the unblocked imide. These groups, X, can be cleaved by acid under the proper conditions to regenerate the unblocked imide. Also, where the imide group is incorporated in a polymer, the polymer with blocked imide groups can be made to function as a resist when compounded with a substance capable of forming an acid upon exposure to radiation.

The exact nature of the imide containing polymer is not critical, providing that: (1) in the unblocked state, the polymer is completely soluble in aqueous alkali; (2) in the blocked state, it is insoluble in the same aqueous solution, while simultaneously; (3) in the blocked state, it is soluble in a solvent capable of dissolving a suitable sensitizer; and (4) it is film forming. Other secondary properties may be selected (to enhance the characteristics of the resist) by varying the structure of the imide or a comonomer.

39 Claims, No Drawings

HIGH RESOLUTION PHOTORESIST OF IMIDE CONTAINING POLYMERS

This is a divisional of co-pending application Ser. No. 06/832,116 filed on Feb. 24, 1986 now U.S. Pat. No. 4,837,124.

The invention relates to photoresist compositions suitable for deep UV and excimer laser lithography. The photoresist compositions are mixtures of a photoacid and a polymer having imide residues to which acid labile groups are attached. These compositions provide high resolution, high contrast and high sensitivity in the deep UV (wavelength of 250–300 nm), mid-UV (wavelength of 300–350 nm) or conventional (wavelength of 350–450 nm) exposure bands and are also suitable for exposure at wavelengths commonly associated with excimer laser sources (248, 308 nm) or for exposure by X-radiation.

BACKGROUND OF THE INVENTION

Presently available resists usually have one or more drawbacks. For example, most negative acting resists have limited resolution because they swell upon development or, in the case of positive acting, novolac resin based resists, are formulated from materials which are opaque at the shorter wavelengths needed for high resolution work, or are very insensitive as in the case of positive acting, polymethyl methacrylate based resists.

Some problems and recent developments associated with high resolution lithography are described, for example, by M. J. Bowden (ACS Symposium Series 266, American Chemical Society, Washington, D.C. 1984, p. 39–117).

Processes have been developed to circumvent these problems (multi-level resists), but they are complex and require an increase in the number of steps per device layer. An ideal resist would be a single layer which could be exposed with deep UV light (250 to 300 nm) (DUV), X-rays, or electron beam radiation.

In addition to high resolution, which is a measure of how small a structure can be created in the resist, high contrast (defined for a resist as a measure of the resist's sensitivity to changes in exposure dose) is a desirable feature for high resolution resists. This is true because the image formed by the exposure tool is not perfect but has a contrast (defined for the tool as the sharpness of its image) limited by the laws of optics and the size of the structure to be reproduced. The resist must correct the fuzziness of the projected image to give a structure of proper size with sharp vertical walls. This is particularly important for structures having widths less than $1\frac{1}{2}\mu$ meter, since the resist film is typically 1 to $1\frac{1}{2}\mu$ meter thick. If the resist wall is not vertical, any subsequent process step which erodes a portion of the resist surface, such as reactive ion etching, will change the width of the structure which in turn can have a deleterious effect on the circuit being produced. The higher the contrast of a resist the more the resist can correct for low contrast in the projected image, and the smaller will be the features of an image which can be successfully exposed to give a usable structure.

High sensitivity is also an essential property of a high resolution resist. The economics of semiconductor device manufacture require high throughput. This means that the time taken to expose each wafer must be minimized. As a result, the exposure energy per unit area of resist is constrained. Furthermore, some exposure tools have less total energy available in the bands used to achieve high resolution than they have in their conventional, low resolution exposure bands. This further reduces the energy available at the wafer suface.

The use of cationic photoinitiators (such as those disclosed in U.S. Pat. Nos. 3,981,897; 4,450,360; or 4,374,086) to cleave polymer pendant groups so as to change the polymer structure to an extent sufficient to create significantly different solubility characteristics in the irradiated and unirradiated areas is disclosed in U.S. Pat. No. 4,491,268. The polymers described as useful in U.S. Pat. No. 4,491,268 are blocked poly-4-hydroxy styrenes, a blocked poly 4-vinylbenzoate, blocked polyisopropenylphenyloxyacetates or blocked poly-methacrylates. The blocking groups said to be useful included a wide range of acid labile groups, such as trityl, benzyl or tert-butoxy. This includes structures such as

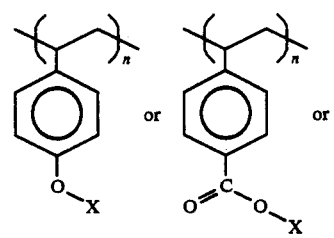

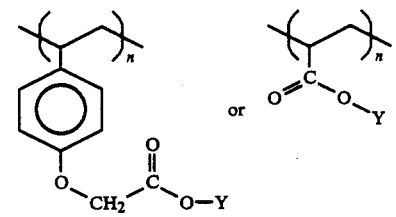

where X and Y are acid labile blocking groups, e.g.,

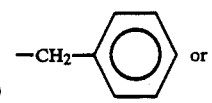

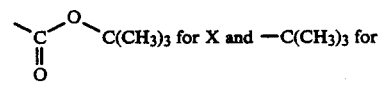

Y. The structures of the deblocked polymers present after irradiation and baking are

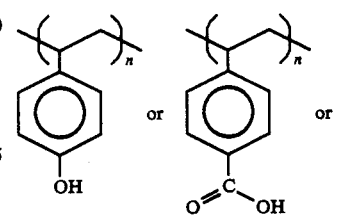

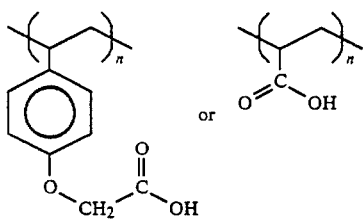 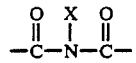

respectively.

In short, there is a need for new resists having high sensitivity, high contrast and high resolution. The need arises from the desire of semiconductor manufacturers to produce structures smaller than 1¼ μm in width.

SUMMARY OF THE INVENTION

The present invention provides for a resist having high contrast, high sensitivity, and high resolution which may be exposed by X-radiation, electron beam radiation, and particularly by ultraviolet light in the wavelength region from 250 nm to 350 nm.

In accordance with the invention, we have found that the imide group

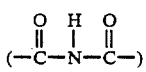

can be blocked with certain groups, X, to form compounds containing the structure

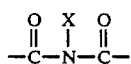

which have solubility properties different from the unblocked imide. These groups, X, can be cleaved by acid under the proper conditions to regenerate the unblocked imide. Where the imide group is incorporated in a polymer, the polymer with blocked imide groups can be made to function as a resist when compounded with a substance capable of forming an acid upon exposure to radiation. The exact nature of the imide containing polymer is not critical, provided that: (1) in the unblocked state, it is completely soluble in aqueous alkali; (2) in the blocked state, it is insoluble in the same aqueous solution while simultaneously; (3) in the blocked state it is soluble in a solvent capable of dissolving a suitable sensitizer and finally; (4) in the blocked state it should be film forming. There are other secondary properties which may be selected (to enhance the characteristics of the resist) by varying the structure of the imide or a comonomer.

DETAILED DESCRIPTION OF THE INVENTION

In the invention, we have discovered that the imide group

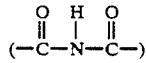

can be blocked with certain groups, X, to form compounds containing the structure $$\begin{matrix} O & X & O \\ \| & | & \| \\ -C-N-C- \end{matrix}$$

which has solubility properties different from the unblocked imide, and that these groups, X, can be cleaved by acid under the proper conditions to regenerate the unblocked imide. Furthermore, if the imide group is incorporated in a polymer, the polymer with blocked imide groups can be made to function as a resist when compounded with a substance capable of forming an acid upon exposure to radiation. We have found that the exact nature of the imide containing polymer is not critical, providing that certain properties are observed, i.e.: (1) in the unblocked state, the polymer should be completely soluble in aqueous alkali; (2) in the blocked state, the polymer should be insoluble in the same aqueous solution, while simultaneously; (3) in the blocked state the polymer should be soluble in a solvent capable of dissolving a suitable sensitizer, and finally; (4) in the blocked state, the polymer should be film forming. However, there are other secondary properties which may be selected (to enhance the characteristics of the resist) by varying the structure of the imide or a comonomer.

The imide containing polymer may have the structures

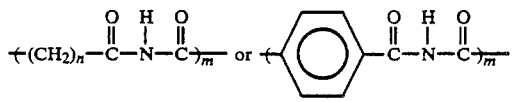

where the imide moiety is contained in the polymer backbone itself. If this is the case, the blocked imide containing polymers will have the structures

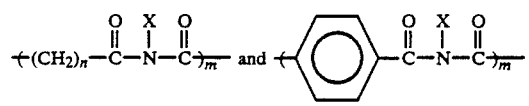

respectively.

Alternatively, the imide moiety may be pendent from the polymer backbone such as in the structures

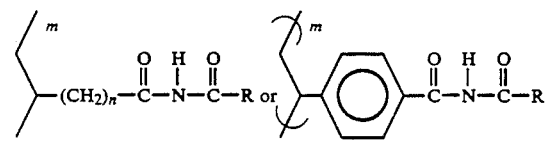

where the blocked polymer will have the structures

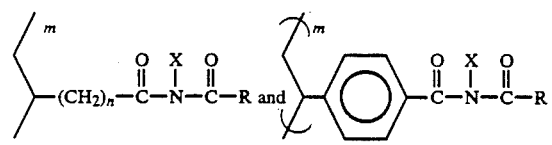

respectively, where R is an alkyl or aryl group. The imides may have a cyclic structure which results in a blocked polymer having the structure

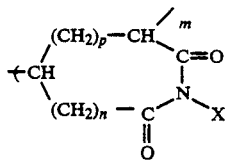

in the case of a polymer where the imide is in the backbone or such as

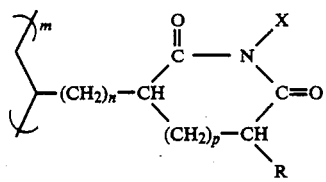

where R is alkyl or aryl or H, in the case of a pendent imide. In all these cases, n and p are from 0 to 10 and m varies with the degree of polymerization and may be from 5 to 100.

Ease of preparation will naturally favor certain structures over other. For example, polymaleimide

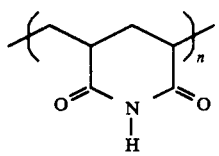

or a polyglutarimide, such as that of Gleim, et al. (U.S. Pat. No. 4,524,121)

may be selected as the parent imide to give the blocked polymers

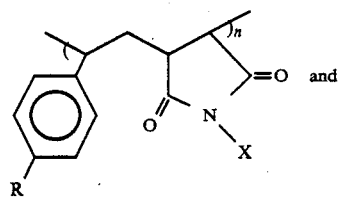

where X is the acid labile blocking group. Alternatively, for a fixed imide structure the kind and amount of non-imide structure incorporated into the polymer may be varied. For example, a copolymer of maleimide and a styrene

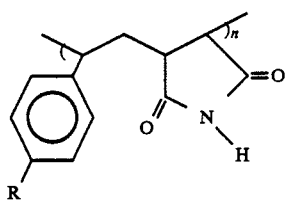

or maleimide and a vinyl ether

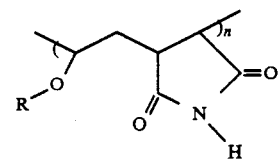

can be blocked to give

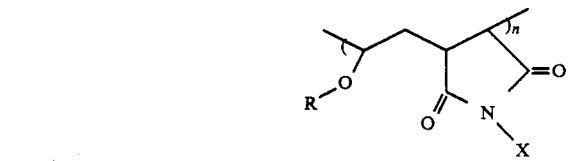

respectively, where X is an acid labile blocking group and R is an alkyl or aryl group.

The acid labile group X should be reasonably stable at 100° C., to permit baking of freshly spun resist films to remove solvent. Furthermore, it must not react with the developer or sensitizer in such a way as to render the resist functionally inoperative. From the known set of acid labile protecting groups the groups found to be most effective are oxycarbonyl groups,

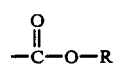

where R is an alkyl, aryl, or substituted alkyl or aryl group. The preferred acid labile group for this invention is tert-butoxy carbonyl

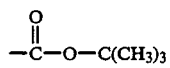

which has been found to be easily attached to preformed imide containing polymer and is stable at temperatures below about 110° C. This group is not readily attacked by aqueous alkali nor is it reactive in the presence of unexposed, latent photoacid.

The latent photoacid may be selected from a wide range of substances known to form acids upon irradiation including diazoketones, such as diazonaphthoquinones

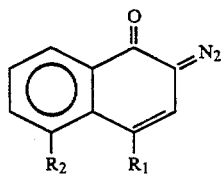

or 5-diazobarbituric acid derivatives, disclosed in the co-pending U.S. patent application Ser. No. 805,641 filed on Dec. 6, 1985, such as

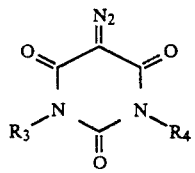

where $R_1$ and $R_2$ are either sulfonyl moieties

or H (but not the same) and $R_3$, $R_4$ and $R_5$ are alkyl or aryl groups. Additionally, "onium" salts such as diazonium, iodonium or sulfonium salts may be used as the photoacids in this invention, e.g., $$R_6N_2^+Y^-, (R_6)_2I_2^+, (R_6)_3S^+Y^-$$

where $R_6$ is phenyl or substituted aryl. The choice of onium salt is dictated by the spectral and thermal characteristics desired in the resist. The choice of gegenion, $Y^-$, may be made from a wide range of anionic species. However, properties such as the marginal stability of, e.g., onium bisulfate or chloride salts and the potential hazards of, e.g., arsenic, phosphorous, boron, or antimony to the integrity of the circuits being fabricated, cause anions such as $HSO_4^-$, $Cl^-$, $BF_4^-$, $PF_6^-$, $AsF_6^-$, or $SbF_6^-$ to be less desirable than anions such as triflate ($CF_3SO_3^-$) or methane sulfonate or, generally $RSO_3^-$ where R is alkyl, aryl, or substituted alkyl or aryl. The principal characteristic of the gegenion is, however, that it be the conjugate base of a strong acid so that the equilibrium $$H^+ + Y^- \rightleftharpoons HY$$

will be such that the protons generated by exposure and subsequent reaction of the onium salt are not "consumed" to give primarily HY but remain available to attack the acid labile blocking group attached to the imide.

It is recognized that the choice of latent photoacid (or even gegenion in the case of onium salt) may effect the rate of reaction, or the diffusion of the photogenerated acid from the initially irradiated zone, in ways dependent on both the photoacid itself and on the nature of the blocked polymer; this may effect the imaging properties of the resist. Further, the choice of photoacid (or gegenion in the case of onium salt) may result in imparting excessive hydrophobic or hydrophilic character to the resist film, which can overwhelm the properties of the imide (and/or blocked imide) containing polymer in such a way as to render the resist inoperable.

In order that the invention may be more fully understood, the following examples are set forth for the purpose of illustration. The specific enumeration of details, however, should not be interpreted as a limitation, except as expressed in the appended claims.

EXAMPLE 1

Preparation of Blocked Polymer

Maleimide styrene copolymer (2.00 g) was dissolved in dry tetrahydrofuran (THF) (20 ml). After the polymer had dissolved, tert-butyl alcohol was added (4.0 ml) and the mixture was cooled to a temperature of 0 to 5° C. Then a solution of potassium tert-butoxide (1.20 g) dissolved in THF (5.0 ml) was added over a period of 10 minutes, with vigorous stirring, so that the temperature remained below 5° C. After a total of 40 minutes stirring, di-tert-butyl dicarbonate (2.20 g), with a few ml of THF added to prevent solidification, was added all at once and the mixture was warmed to 30° C. and stirred for 4 hours. Finally, the gelatinous mass was poured into distilled water (200 ml) with vigorous stirring, allowed to settle for 30 minutes and filtered. The filtrate was washed with water (200 ml) then methanol (200 ml) and dried at room temperature under a stream of nitrogen. The polymer (2.4 g) was shown by $^1$H NMR to have at least 90% of its imide N-H groups blocked with tert-butyloxycarbonate,

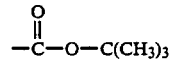

Preparation of the Photoacid Sensitizer

Diphenyliodonium chloride (2.00 g) was dissolved in methanol (30 ml). Then silver triflate (1.70 g) dissolved in methanol (10 ml) was added to it, with stirring. After a few minutes the solid silver chloride was removed by filtration and the methanol was removed under vacuum. The crude product was recrystallized from water (40 ml) and allowed to dry at room temperature over night. The recrystallized diphenyliodonium triflate weighed 2.34 g (86% yield) (m.p. 183–185° C.).

Preparation of Photoresist Films

Blocked maleimide styrene copolymer (1.80 g) and diphenyl iodonium triflate sensitizer (0.20 g) were dissolved in diglyme (5.4 g) by stirring the mixture at room temperature. Then the solution was forced through a 0.2 μm membrane filter to remove particulates. This solution, when spin-cast at 5,000 RPM, would provide a film 1.2 μm thick.

Wafers were spin-coated on a Headway Research spinner and baked at 80° C. for 20 minutes to remove solvent.

Exposure and Development of Resist Film

Two inch resist-coated wafers were exposed (contact print) through a 260±15 nm interference filter and an Optoline step tablet mask. The energy incident at the wafer surface was estimated by use of an Eppley calibrated thermopile.

Five and six inch wafers were exposed with a Perkin-Elmer Micralign TM -b 500, or 600-HT, scanning projector operating in the UV-2 band.

After exposure, the wafers were baked in a forced convection oven at 130° C. for a period of 3 minutes to allow the photoinduced acid to de-block the imides. Then they were developed in 0.1 M aqueous hydroxide solution (50:50 tetramethylammonium hydroxide and tetrabutylammonium hydroxide), rinsed with deionized water and dried under a stream of filtered nitrogen. The contact printed 2 inch wafers showed a sensitivity of 18 to 20 mJcm$^{-2}$, 1 $\mu$m features were clearly reproduced with flat tops and vertical side walls. The contrast was high $-\gamma \geq 8$, with $\gamma$ being defined as in G. N. Taylor, "Guidelines for Publication of High Resolution Resist Parameters", *Solid State Technology* (1984) June, p. 105, Section G.2.a). The projection printed wafers were properly exposed in a scan time of from 11 to 20 seconds and submicron features ($\frac{3}{4}\mu$m) were easily formed with flat tops and nearly vertical side walls.

Without further processing, the wafers could be heated to 230° C. without rounding of the photoresist features.

EXAMPLE 2

A resist was prepared in the manner of Example 1 except that the sensitizer used was triphenyl sulfonium triflate. This sensitizer has absorbance at longer wavelengths of light which extends the utility of the resist from the DUV to the Mid UV region (250-350 nm). Resist films were prepared on 2-inch silicon substrates as detailed in Example 1. The resist-coated wafers were exposed (contact print) to either 260 nm light as in Example 1, or to narrow band 313 nm light (again, through an interference filter). After exposure, the wafers were baked at 110° C. for 7 minutes. After baking, they were developed and rinsed as in Example 1. Wafers exposed at both wavelengths showed a sensitivity of 25 mJcm$^{-2}$ with 1 micron features clearly resolved. This example demonstrates a method of tailoring the sensitizer to a desired spectral region.

EXAMPLE 3

A blocked polymer was prepared as in Example 1, except that the copolymer used was maleimide-co-tert-butyl styrene. After blocking, the polymer was used to prepare a resist as in Example 1. This resist was used to prepare films on 2-inch silicon substrates as in Example 1. The resist-coated silicon wafers were exposed (contact print) to 260±15 nm light through an Optoline step tablet resolution mask. After exposure, the wafers were baked for 1 hour at 100° C. After baking, the wafers were developed in 0.35N aqueous tetramethylammonium hydroxide solution, rinsed with deionized water and dried under a stream of filtered nitrogen. The contact printed wafers showed a sensitivity of 15 mJcm$^{-2}$ and 1 micron features were clearly reproduced. The contrast of the resist was very high ($-\gamma>6$). There was no loss of film thickness in the unirradiated areas during the development. This example shows that the comonomer to maleimide in the polymer can be other than styrene.

EXAMPLE 4

A resist was prepared in the manner of Example 1. The resist was coated onto 3-inch oxide-coated silicon wafers in the manner of Example 1. The resist-coated wafers were exposed to X-ray irradiation through a gold on tantalum mask. The X-rays were produced by a rotating tungsten source (8000 RPM) with a 2 mm spot size. The source power was 10 kV at 600 mA. The wafers were exposed through the mask for 8 minutes then baked for 5 minutes at 120° C. After baking, the wafers were developed in the manner of Example 1. The resist developed in a positive tone with very high contrast and imaged 1 micron features.

EXAMPLE 5

A resist was prepared, coated on 2-inch silicon wafers and exposed in the manner of Example 1. After exposure, the wafers were baked for 45 seconds to 1 minute at 160° C., then developed as in Example 1. The sensitivity of resists processed in this manner was 15 to 17.5 mJcm$^{-2}$ with high contrast and <1% film loss in the unirradiated areas during development. One micron features with vertical sidewalls were easily resolved. This example shows that the bake time can be adjusted by varying the bake temperature, without undue loss of resist performance.

EXAMPLE 6

A resist was prepared, coated on 2-inch silicon wafers and exposed (contact print) in the manner of Example 1. The exposed wafer was baked in the manner of Example 5. After baking, the wafer was developed in 0.1N potassium hydroxide. The sensitivity of the resist was 13 mJcm$^{-2}$ and the contrast was high. One micron features were easily resolved. This example shows that metal ion developers will also serve to develope the exposed and baked resist.

EXAMPLE 7

A resin was prepared in the manner of Example 1. It was compounded in a resist as in Example 1, except that the sensitizer was a conventional diazonaphthoquinone sensitizer (4-benzoyl-1,3-phenylene ester of 3-diazo-3,4-dihydro-4-oxo-1-naphthalene sulfonic acid). The resin to sensitizer ratio was 7:1. The resist was coated and exposed (contact print) as in Example 1. The exposed wafers were baked for 1 hour at 100° C. and then developed in 0.1 to 0.3N tetramethyl ammonium hydroxide, rinsed with deionized water and dried under a nitrogen stream. The sensitivity of the resist was 48 mJcm$^{-2}$ and 1 $\mu$m features were resolved. The contrast was lower than in Example 1, $-\gamma=2$.

EXAMPLE 8

A resin was prepared in the manner of Example 1. It was compounded in a resist in the manner of Example 1 except that the sensitizer was triphenylsulfonium hexafluoroarsenate. The resist was coated on 2-inch silicon wafers and exposed (contact print) as in Example 1. The exposed wafers were baked for 1 hour at 100° C. and then developed in either 0.1N aqueous tetramethyl ammonium hydroxide or 0.1N aqueous potassium hydroxide. The sensitivisty of the resist was 32 mJcm$^{-2}$ and the contrast was high with $-\gamma=4$. One micron features were resolved.

EXAMPLE 9

A resist was prepared in the manner of Example 8, except that the sensitizer was diphenyliodonium hexafluorophosphate. The resist was coated on 2-inch silicon wafers and exposed in the manner of Example 1 (contact print), then baked and developed in the manner of Example 8. The sensitivity of the resist was 56 mJcm$^{-2}$ and $-\gamma$ was >10. One micron features were resolved.

EXAMPLE 10

Resist coated 2-inch silicon wafers were prepared in the manner of Example 8. After the normal softbake to remove the solvent the wafers were exposed with a krypton fluoride excimer laser operating at 248 nm. The projection optics provided a 5:1 reduced image of a chrome on quartz photomask to produce an irradiated pattern of 1 μm lines and spaces on the resist. The total fluence of 248 nm light on the resist was approximately 100 mJcm$^{-2}$, delivered in three pulses. After the exposure, the wafers were baked for 1 hour at 100° C. and then developed in 0.15N aqueous hydroxide solution (50:50 tetramethyl ammonium hydroxide and tetrabutyl ammonium hydroxide). One micron lines and spaces were easily resolved.

EXAMPLE 11

A resist was prepared in the manner of Example 1, except that the sensitizer was triphenylsulfonium triflate. The resist was coated on oxide-coated, 5-inch silicon wafers in the manner of Example 1. The wafers were exposed with a Perkin-Elmer Micralign TM -500 in the UV-3 band. After exposure, the wafers were baked for 6 minutes at 120° C. After baking, the wafers were developed in the manner of Example 1. One micron features were resolved.

EXAMPLE 12

A resist was prepared in the manner of Example 1. The resist was coated on oxide-coated, 5-inch silicon wafers in the manner of Example 1. The wafers were exposed with a Perkin-Elmer Micralign TM -500 in the UV-2 band. The scan time for proper exposure was approximately 20 seconds. After exposure, the wafers were baked for 150 seconds on a commercial vacuum hotplate at 130° C. After baking, the wafers were developed in the manner of Example 1. Submicron features (¾ μm lines and spaces) were easily resolved with flat tops and nearly vertical sidewalls.

EXAMPLE 13

A resist was prepared in the manner of Example 1. The resist was coated on oxide-coated (SiO$_2$), 5-inch silicon wafers in the manner of Example 1. The wafers were exposed with a Perkin-Elmer Micralign TM -500 in the UV-2 band. After exposure, the wafers were baked for 6 minutes at 120° C. and developed in the manner of Example 1. A wafer with the resist pattern on it was placed in a Perkin-Elmer OmniEtch TM and the photoresist pattern was transferred into the silicon dioxide substrate by reactive ion etching. After etching, the wafer was broken and examined by scanning electron microscopy. The SEM photos showed that the pattern of submicron (¾ μm) lines and spaces in the photoresist had been accurately etched into the substrate with nearly vertical sidewalls and no rounding of the resist edges.

EXAMPLE 14

A resin was prepared in the manner of Example 1, except that 0.6 gm of potassium tert-butoxide dissolved in THF (5.0 ml) were used. After reaction, 50% of the imide groups were blocked and 50% remained unblocked. The percentage of blocking was determined by proton nuclear magnetic resonance (nmr). This resin was compounded in a resist, coated on 2-inch silicon wafers and exposed in the manner of Example 1. The 2-inch, contact printed wafers displayed a sensitivity of 21 mJcm$^{-2}$ and very high contrast when baked for 10 minutes at 120° C. and developed in 0.1N potassium hydroxide. The film retention in the unirradiated areas was 70%. One micron lines were easily resolved. This example illustrates that incompletely blocked, imide-containing polymer can be made to function as a high contrast photoresist.

EXAMPLE 15

A resin was prepared in the manner of Example 1 such that at least 90% of the imide functionalities were blocked by tert-butyloxycarbonate groups (as shown by proton nmr). This resin was baked for 10 minutes at 120° C. in order to partially deblock it by thermal cleavage. The resin was shown to be only 70% blocked after baking by proton nmr and by weight loss calculations. This resin was then compounded in a resist in the manner of Example 1. The resist was coated on 2-inch silicon wafers and exposed (contact print) in the manner of Example 1. After exposure, the wafers were baked 4 minutes at 130° C. then developed in the manner of Example 1. The resist showed a sensitivity of 17 to 20 mJcm$^{-2}$ with high contrast. One micron features were easily resolved. The unirradiated areas of the film lost only 1% of their thickness in the development step. This example shows that the percentage blocking of a polymer can be reduced by a thermal deblocking process in order to adjust the properties of the resist made from the polymer.

EXAMPLE 16

A blocked polymer was prepared in the manner of Example 1 except that the copolymer used was maleimideco-decyl vinyl ether. After blocking, the polymer was used to prepare a resist in the manner of Example 1. This resist was coated onto 2-inch silicon wafers and exposed (contact print) as in Example 1. After exposure, the resist-coated wafers were baked for 10 minutes at 110° C. and then developed in 0.075N aqueous tetramethyl ammonium hydroxide. The sensitivity of the resist was 240 mJcm$^{-2}$ and the film retention was 30%.

EXAMPLE 17

(Comparative)

A photoresist was compounded from a novolac resin and the diazonaphthoquinone sensitizer of Example 7. The resin to sensitizer ration was 8:1 and the solvent was diglyme. The resist was filtered, spin-coated onto oxide-coated, 5-inch silicon wafers and baked for 40 minutes at 80° C. to remove the residual spinning solvent. The resist-coated wafers were then exposed on a Perkin-Elmer Micralign TM -500 in either the UV-2 (Deep UV) or UV-4 (Near UV) band. After exposure, the wafers were developed in 0.128N aqueous potassium hydroxide for a period of 3 minutes. The sensitivity of the novolac-based resist was 36 mJcm$^{-2}$ in the near UV region and 70 mJcm$^{-2}$ in the deep UV region. Scanning electron micrographs of the resist features showed straight sidewalls for the near UV exposures, but sloped (45°) sidewalls for the deep UV exposures. The contrast of the resist was measured to be $-\gamma=5.5$ in the near UV and $-\gamma=1$ in the deep UV. Film retention in the unirradiated areas averaged 97%. This example illustrates the lack of utility of novolac-based resists in the deep UV region.

EXAMPLE 18

A resin can be prepared in the manner of Example 1 except that the copolymer used is a copolymer of maleimide and 4-methylstyrene or 4-ethylstyrene or 4-isopropylstyrene or 2,4-dimethylstyrene or 4-n-butylstyrene or α-methylstyrene or n-butyl vinyl ether or tert-butyl vinyl ether or n-hexyl vinyl ether or n-octyl vinyl ether or 2-ethylhexyl vinyl ether or n-decyl vinyl ether or n-dodecyl vinyl ether or n-tetradecyl vinyl ether or n-hexadecyl vinyl ether or n-octadecyl vinyl ether. After the polymer is blocked in the manner of Example 1, it can be compounded in a resist, coated, exposed, baked and developed in the manner of Example 1 in order to provide a relief image in the resist on the substrate. The melting point of the features will be determined by the glass transition temperature (Tg) of the copolymer.

EXAMPLE 19

A resin can be prepared in the manner of Example 1 except that the polymer to be blocked is a homopolymer of maleimide. The blocked homopolymer can then be compounded in a resist and further processed as in Example 1, except that the melting point of the resist features will be determined by the Tg of the homopolymer.

EXAMPLE 20

A resin can be prepared in the manner of Example 1, except that the polymer to be blocked contains polydimethylglutarimide. The blocked imide polymer can then be compounded in a resist and further processed as in Example 1. The melting point of the features will be determined by the Tg of the polydimethylglutarimide.

EXAMPLE 21

A resin can be prepared in the manner of Example 1 where the blocking group is the benzyloxycarbonyl group ($-CO_2-CH_2-C_6H_5$), by reacting the imide anion salt (the intermediate product formed by reacting the imide-containing polymer with potassium tert-butoxide as in Example 1) with benzyl chloroformate. Once the polymer is blocked, it can be compounded in a resist and further processed in the manner of Example 1.

EXAMPLE 22

The polymer of Example 1 can be formed by alternate synthetic routes. For example, N-[tert-butyloxycarbonyl] maleimide is copolymerized with styrene by heating a cyclohexanone solution of styrene and N-blocked maleimide, in the presence of azobisisobutyronitrile, to 60° C. for 10 hours. The polymer is isolated by pouring the cyclohexanone solution into water and filtering the precipitated polymer.

EXAMPLE 23

Resist coated wafers are prepared in the manner of Example 1, then exposed to a source of electron beam irradiation. After exposure, the wafers are baked and developed in the manner of Example 1 to yield a relief pattern in the photoresist on the substrate.

EXAMPLE 24

Di-4-methylphenyl iodonium chloride is dissolved in methanol. Silver triflate, dissolved in methanol, is added to this solution with stirring. After a few minutes, the solid silver chloride is removed by filtration and the methanol is removed under vacuum.

This photoacid sensitizer is then used according to the method of Example 1 except that the spectral range to which the resist is sensitized is shifted 15 nm to the red. This example shows how aryl substituents in the iodonium salt may be used to alter the spectral sensitivity of the resist.

EXAMPLE 25

The photoresist of Example 1 can be prepared, coated, exposed ($260\pm15$ nm, 100 mJcm$^{-2}$) and baked in the manner of Example 1. The baked wafer contains nonpolar areas where the resist is still blocked (unirradiated areas) and polar areas where the imides have been unblocked (irradiated areas). The wafer is developed in a non-polar developer (methylene chloride) in order to remove the the non-polar areas and leave the polar areas in place on the substrate. The result is an image reversal of the original irradiation pattern, that is, those areas remain which would have been developed away in an aqueous alkaline developer.

EXAMPLE 26

The photoresist of Example 1 is further sensitized with a small amount of an organic dye (perylene). The doubly sensitized resist is then coated on 2-inch silicon wafers in the manner of Example 1. The coated wafers are then processed according to the method of Example 1, except that the spectral range to which the resist is sensitized includes the absorption bands of perylene. This example shows how a secondary sensitizer is used to extend the spectral sensitivity of the resist to wavelengths where the latent photoacid sensitizer does not absorb.

While particular embodiments of the invention have been described, it will be understood, of course, that the invention is not limited thereto since many modifications may be made, and it is, therefore, contemplated to cover by the appended claims any such modifications as fall within the true spirit and scope of the invention.

What is claimed is:

1. An article comprising a substrate and a dried photoresist composition on the substrate, the photoresist composition comprising a mixture of:
   (a) from 1 to 50% by weight of a latent photoacid; and
   (b) from 50 to 99% by weight of a film forming imide containing polymer having a sufficient number of imide N-H groups replaced by acid labile groups to render the polymer insoluble in aqueous alkali, the composition comprising a solvent which dissolves both the latent photoacid and the polymer.

2. A method of producing a positive tone relief image on a semiconductor substrate comprising forming a photoresist composition comprising a mixture of:
   (a) from 1 to 50% by weight of a latent photoacid; and
   (b) from 50% to 99% by weight of a film forming imide containing polymer having a sufficient number of imide N-H groups replaced by acid labile groups to render the polymer insoluble in aqueous alkali; coating the composition on a semiconductor substrate; drying the composition; imagewise exposing the composition to imaging radiation; deblocking at least a portion of the imides; and developing the composition with an aqueous alkaline developer to thereby produce a positive relief image.

3. A method of producing a negative tone relief image on a semiconductor substrate, comprising forming a photoresist composition of comprising a mixture of:
(a) from 1 to 50% by weight of a latent photoacid; and
(b) from 50 to 99% by weight of a film forming imide containing polymer having a sufficient number of imide N-H groups replaced by acid labile groups to render the polymer insoluble in aqueous alkali; coating the composition on a semiconductor substrate; drying the composition; imagewise exposing the composition to imaging radiation; deblocking at least a portion of the imides; and developing the composition with an organic non-polar developer to thereby produce a negative relief image.

4. An article which comprises a substrate and a dried light composition on said substrate, which composition comprises
(i) from 1 to 50 by weight percent of a latent photoacid and
(ii) from 50 to 99 by weight percent of a film forming imide containing polymer having a sufficient number of imide N-H groups replaced by acid labile groups to render the polymer insoluble in aqueous alkali.

5. The article of claim 4 wherein the latent photoacid is an iodonium salt.

6. The article of claim 5 wherein the iodonium salt is selected from the group consisting of a diphenyl iodonium salt, a 4-methylphenyl iodonium salt, and a 4-methoxyphenyl iodonium salt.

7. The article of claim 6 wherein the iodonium salt is selected from the group consisting of diphenyl iodonium triflate; di-4-methylphenyl iodonium triflate; and (4-methoxyphenyl)phenyl iodonium triflate.

8. The article of claim 4 wherein the latent photoacid is a sulfonium salt.

9. The article of claim 8 wherein the sulfonium salt is selected from the group consisting of a phenyl sulfonium salt; a methylphenyl sulfonium salt, and a 4-methoxyphenyl sulfonium salt.

10. The article of claim 9 wherein the sulfonium salt is a triphenyl sulfonium triflate.

11. The article of claim 4 wherein the latent photoacid is a diazonaphthoquinone.

12. The article of claim 11 wherein the diazonaphthoquinone is 2,4-bis(1,2-dihydro-1-oxo-2-diazonaphthalene-4-sulfonato)benzophenone.

13. The article of claim 4 wherein the imide containing polymer contains succinimide or glutarimide residues.

14. The article of claim 13 wherein the imide containing polymer is poly-co(maleimide styrene) or poly-co(-maleimide-4-tertbutyl styrene).

15. The article of claim 14 wherein 50 to 100% of the imide of N-H groups are replaced with acid labile groups.

16. The article of claim 13 wherein the acid labile group is an oxycarbonyl group.

17. The article of claim 16 wherein the oxycarbonyl group is tert-butoxy carbonyl or benzyloxy carbonyl.

18. The article of claim 4 wherein the imide containing polymer contains acyclic imide residues.

19. The article of claim 18 wherein in 50 to 100% of the imide N-H groups are replaced with acid labile groups.

20. The article of claim 19 wherein the acid labile group is an oxycarbonyl group.

21. The article of claim 4 wherein a sensitizer capable of transferring energy to the latent photoacid is incorporated in the composition.

22. A method of producing a positive or negative image which comprises
(a) forming a composition comprising
(i) from 1 to 50 weight percent of a latent photoacid and
(ii) from 50 to 99 weight percent of a film forming imide containing polymer having a sufficient number of imide N-H groups replaced by acid labile groups to render the polymer insoluble in aqueous alkali, the composition being dissolved in a solvent which dissolves both the latent photoacid and the polymer; and
(b) coating said composition on a substrate to form a substantially uniform film of the composition on the substrate; and
(c) heating said composition for a sufficient time and at a sufficient temperature to substantially dry the composition; and
(d) imagewise exposing the composition to sufficient imaging energy to form a latent image; and
(e) developing the composition with an aqueous alkaline solution to form a positive image or an organic nonpolar solvent developer to obtain a negative image.

23. The method of claim 22 wherein the latent photoacid is an iodonium salt.

24. The method of claim 22 wherein the iodonium salt is selected from the group consisting of a diphenyl iodonium salt, a 4-methylphenyl iodonium salt, and a 4-methoxphenyl iodonium salt.

25. The method of claim 24 wherein the iodonium salt is selected from the group consisting of diphenyl iodonium triflate; di-4-methylphenyl iodonium triflate; and (4-methoxyphenyl)phenyl iodonium triflate.

26. The method of claim 22 wherein the latent photoacid is a sulfonium salt.

27. The method of claim 26 wherein the sulfonium salt is selected from the group consisting of a phenyl sulfonium salt; a methylphenyl sulfonium salt, and a 4-methoxyphenyl sulfonium salt.

28. The method of claim 27 wherein the sulfonium salt is a triphenyl sulfonium triflate.

29. The method of claim 22 wherein the latent photoacid is a diazonaphthoquinone.

30. The method of claim 29 wherein the diazonaphthoquinone is 2,4-bis(1,2-dihydro-1-oxo-2-diazonaphthalene-4-sulfonato)benzophenone.

31. The method of claim 22 wherein the imide containing polymer contains succinimide or glutarimide residues.

32. The method of claim 31 wherein the imide containing polymer is poly-co(maleimide styrene) or poly-co(maleimide-4-tert-butyl styrene).

33. The method of claim 32 wherein 50 to 100% of the imide N-H groups are replaced with acid labile groups.

34. The method of claim 31 wherein the acid labile group is an oxycarbonyl group.

35. The method of claim 34 wherein the oxycarbonyl group is tert-butoxy carbonyl or benzyloxy carbonyl.

36. The method of claim 22 wherein the imide containing polymer contains acyclic imide residues.

37. The method of claim 36 wherein 50 to 100% of the imide N-H groups are replaced with acid labile groups.

38. The method of claim 37 wherein the acid labile group is an oxycarbonyl group.

39. The method of claim 22 wherein a sensitizer capable of transferring energy to the latent photoacid is incorporated in the composition.

* * * * *